(12) United States Patent
Cui et al.

(10) Patent No.: US 12,351,529 B2
(45) Date of Patent: Jul. 8, 2025

(54) SYSTEMS FOR AND METHODS FOR IMPROVING MECHANICAL PROPERTIES OF CERAMIC MATERIAL

(71) Applicant: NUtech Ventures, Inc., Lincoln, NE (US)

(72) Inventors: Bai Cui, Lincoln, NE (US); Fei Wang, Lincoln, NE (US); Yongfeng Lu, Lincoln, NE (US); Michael Nastasi, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 0 days.

(21) Appl. No.: 18/310,395

(22) Filed: May 1, 2023

(65) Prior Publication Data
US 2023/0286873 A1 Sep. 14, 2023

Related U.S. Application Data

(62) Division of application No. 16/557,698, filed on Aug. 30, 2019, now Pat. No. 11,667,581.
(Continued)

(51) Int. Cl.
*C04B 41/00* (2006.01)
*B23K 26/0622* (2014.01)
(Continued)

(52) U.S. Cl.
CPC ...... *C04B 41/0072* (2013.01); *B23K 26/0622* (2015.10); *B23K 26/083* (2013.01);
(Continued)

(58) Field of Classification Search
None
See application file for complete search history.

(56) References Cited

U.S. PATENT DOCUMENTS

| 4,338,114 A | 7/1982 | Brockway et al. |
| 4,770,590 A | 9/1988 | Hughes et al. |

(Continued)

FOREIGN PATENT DOCUMENTS

| EP | 0666326 A1 | 3/2001 |
| WO | 2018045605 A1 | 3/2018 |

OTHER PUBLICATIONS

Fuzed_Quartz_-_MatWeb.pdf (Material property data sheet for fused quartz). Retrieved on Apr. 12, 2022 at : https://www.matweb.com/search/DataSheet.aspx?bassnum=BQUARTZ&ckck=1 (2022).

*Primary Examiner* — Elizabeth M Kerr
(74) *Attorney, Agent, or Firm* — Gerald T. Gray; Leydig, Voit, Mayer, LTD.

(57) ABSTRACT

Systems for and methods for improving mechanical properties of ceramic material are provided. The system comprises a heat source for heating the ceramic material to a temperature greater than a brittle-to-ductile transition temperature of the ceramic material; a probe for mounting the ceramic material and configured to extend the ceramic material into the heat source; a plasma-confining medium and a sacrificial layer disposed between the ceramic material and the plasma-confining medium; and an energy pulse generator such as a laser pulse generator. The sacrificial layer is utilized to form plasma between the ceramic material and the plasma-confining medium. The method comprises heating ceramic material to a temperature greater than a brittle-to-ductile transition temperature of the ceramic material and subjecting the ceramic material to energy pulses via a sacrificial layer and a plasma-confining medium whereby a plasma of the sacrificial coating forms between the ceramic material and a plasma-confining medium.

16 Claims, 6 Drawing Sheets

Related U.S. Application Data (60) Provisional application No. 62/725,669, filed on Aug. 31, 2018.

(51) Int. Cl.
| | | |
|---|---|---|
| *B23K 26/08* | (2014.01) | |
| *B23K 26/356* | (2014.01) | |
| *B23K 26/53* | (2014.01) | |
| *B28B 11/00* | (2006.01) | |
| *C04B 41/45* | (2006.01) | |
| *C04B 35/10* | (2006.01) | |

(52) U.S. Cl.
CPC ............ *B23K 26/356* (2015.10); *B23K 26/53* (2015.10); *B28B 11/005* (2013.01); *C04B 41/0036* (2013.01); *C04B 41/4527* (2013.01); *C04B 35/10* (2013.01)

(56) References Cited

U.S. PATENT DOCUMENTS

| | | | |
|---|---|---|---|
| 4,937,421 A | | 6/1990 | Ortiz, Jr. et al. |
| 4,966,549 A | * | 10/1990 | Ohdate .................. C30B 31/14 |
| | | | 211/41.18 |
| 5,437,825 A | | 6/1995 | Murnick |
| 8,330,070 B2 | | 12/2012 | Sano et al. |
| 2007/0039933 A1 | * | 2/2007 | Cheng .................. B23K 26/356 |
| | | | 219/121.69 |
| 2007/0262063 A1 | * | 11/2007 | Sano .................. B23K 26/0876 |
| | | | 219/121.85 |
| 2013/0138363 A1 | | 5/2013 | Enoki et al. |
| 2013/0180969 A1 | | 7/2013 | Cheng et al. |
| 2017/0125268 A1 | * | 5/2017 | Dang ................ H01L 21/67132 |
| 2019/0299485 A1 | | 10/2019 | Yoshida et al. |
| 2020/0102634 A1 | | 4/2020 | Polese et al. |

\* cited by examiner

SYSTEMS FOR AND METHODS FOR IMPROVING MECHANICAL PROPERTIES OF CERAMIC MATERIAL

CROSS REFERENCES

This application is a Divisional application of U.S. patent application Ser. No. 16/557,698, filed on Aug. 30, 2019, which claims priority to U.S. Provisional Patent Application No. 62/725,669, by Cui et al., entitled "SYSTEMS FOR AND METHODS OF IMPARTING FATIGUE RESISTANCE TO CERAMIC MATERIAL," filed Aug. 31, 2018. Each of the afore-mentioned applications is incorporated in its entirety herein by reference.

STATEMENT REGARDING FEDERALLY SPONSORED RESEARCH OR DEVELOPMENT

This invention was made with Government support under project numbers CMMI1563145 by the National Science Foundation. The Government has certain rights in the invention.

BACKGROUND

Several ceramic materials tend to be superior to many metallic materials (e.g., stainless steels, aluminum alloys) in terms of heat resistance, high strength, and wear resistance. However, fatigue resistance and fracture toughness of ceramics (typically <5 MPa m$^{1/2}$) tend to be lower than that of many metals (typically >30 MPa m$^{1/2}$).

Laser shock processing ("LSP") is a surface engineering approach to introduce significant compressive residual stress into ceramics to improve ceramics' mechanical properties. LSP utilizes high-energy nanosecond (ns) laser pulses to irradiate a sacrificial coating on the surface of ceramics to generate plasma. LSP can be used to improve mechanical properties of ceramics, including, but not limited to, bending strength, fracture toughness, fatigue resistance, Weibull modulus, thermal shock resistance, wear resistance, and contact damage resistance. Advantages of LSP include, but are not limited to, deep penetration (>1 mm) of compressive residual stress, fast speed, precise control, accuracy, flexibility and no contamination. However, LSP of ceramics presently is conducted at room temperature, which tends to induce surface flaws (e.g., microcracks) by the laser-induced shock waves due to the intrinsic brittleness of ceramics, which limits the further improvement of mechanical properties of ceramics by LSP.

SUMMARY

The present disclosure provides systems and methods for improving mechanical properties, and in particular fatigue resistance, of ceramic material.

A system for improving one or more mechanical properties of ceramic material is provided. The system comprises a heat source for heating the ceramic material to a temperature greater than a brittle-to-ductile transition temperature of the ceramic material; a probe for mounting the ceramic material at a three-dimensional stage, the probe configured to extend the ceramic material and the three-dimensional stage into the heat source; a plasma-confining medium and a sacrificial layer disposed between the ceramic material and the plasma-confining medium, the sacrificial layer for forming plasma between the ceramic material and the plasma-confining medium when heated to the temperature greater than the brittle-to-ductile transition temperature of the ceramic material and exposed to added energy, typically in the form of energy pulses, e.g., laser pulses; and an energy generator, e.g., energy pulse generator such as a laser pulse generator, for subjecting the ceramic material to the energy pulses via the sacrificial layer and the plasma-confining medium such that the energy pulse generator is configured to pulse energy through the plasma-confining medium onto the sacrificial layer to form the plasma between the ceramic material and the plasma-confining medium.

A method of improving one or more properties of ceramic material is provided. The method includes heating a ceramic material to a temperature greater than a brittle-to-ductile transition temperature of the ceramic material; and subjecting the ceramic material to added energy, typically in the form of energy pulses, e.g., laser pulses, via a sacrificial layer and a plasma-confining medium such that a plasma of the sacrificial coating forms between the ceramic material and a plasma-confining medium.

Reference to the remaining portions of the specification, including the drawings and claims, will realize other features and advantages of the present disclosure. Further features and advantages of the present disclosure, as well as the structure and operation of various embodiments, are described in detail below with respect to the accompanying drawings. In the drawings, like reference numbers indicate identical or functionally similar elements.

BRIEF DESCRIPTION OF THE FIGURES

The detailed description is described with reference to the accompanying figures. The use of the same reference numbers in different instances in the description and the figures may indicate similar or identical items.

DETAILED DESCRIPTION

The present disclosure provides systems and methods for improving mechanical properties, and in particular fatigue resistance, of ceramic material. Any suitable ceramic material may be processed by or subjected to the methods and systems provided herein. Non-limiting examples of ceramic materials include, e.g., alumina ("$Al_2O_3$"), zirconia ("$ZrO_2$"), yttrium-stabilized zirconia ("YSZ"), silicon carbide ("SiC"), boron carbide ("$B_4C$"), silicon nitride ("$Si_3N_4$"), aluminum nitride ("AlN"), zirconium boride ("$ZrB_2$"), hafnium boride ("$HfB_2$"), or a combination thereof. The ceramic material may be single-crystal, polycrystalline, and/or a composite substance of two or more ceramic materials.

Figure 1A:
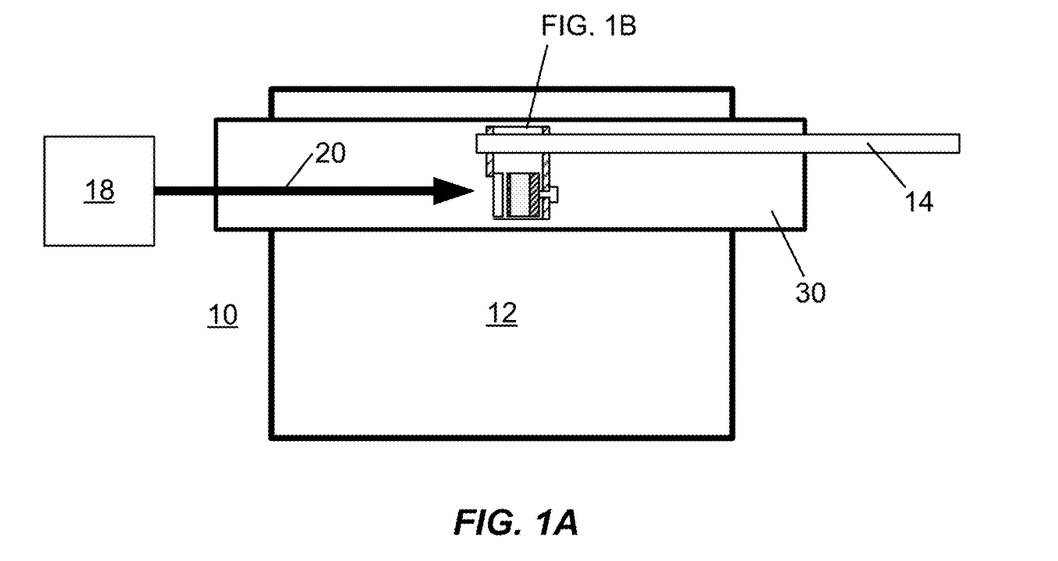
FIG. 1A shows a schematic of a system that may be utilized for imparting fatigue resistance to ceramic material.
Figure 1B:
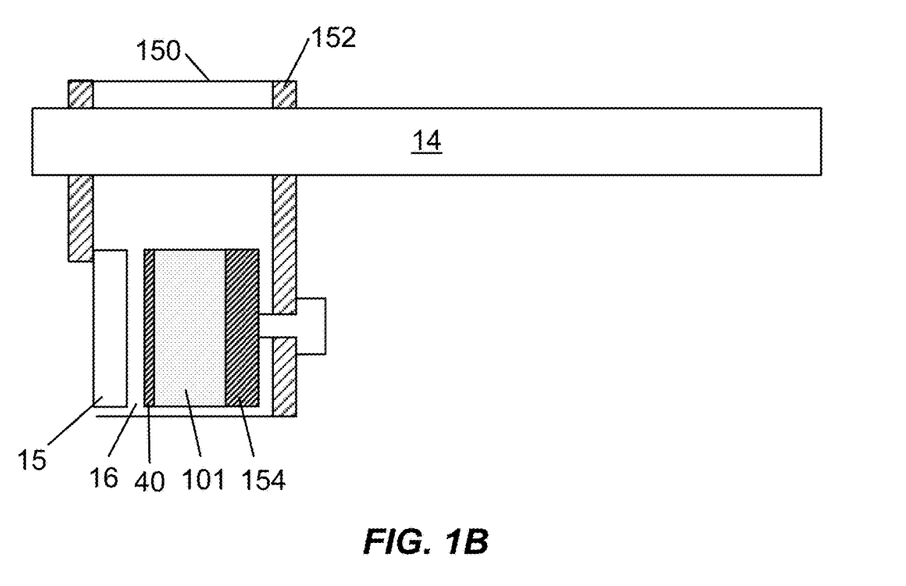
FIG. 1B shows an expanded view of a portion of FIG. 1A, which is a sectional view of how an exemplary holder connects with the probe and how the ceramic sample, plasma-confining medium, and sacrificial layer are affixed to the exemplary holder.
Figure 1C:
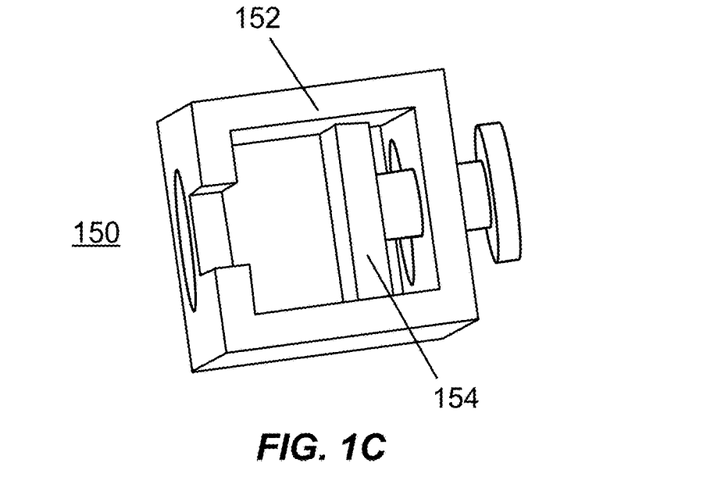
FIG. 1C and FIG. 1D show a diagram and dimensional drawing of an exemplary holder.
Figure 1D:
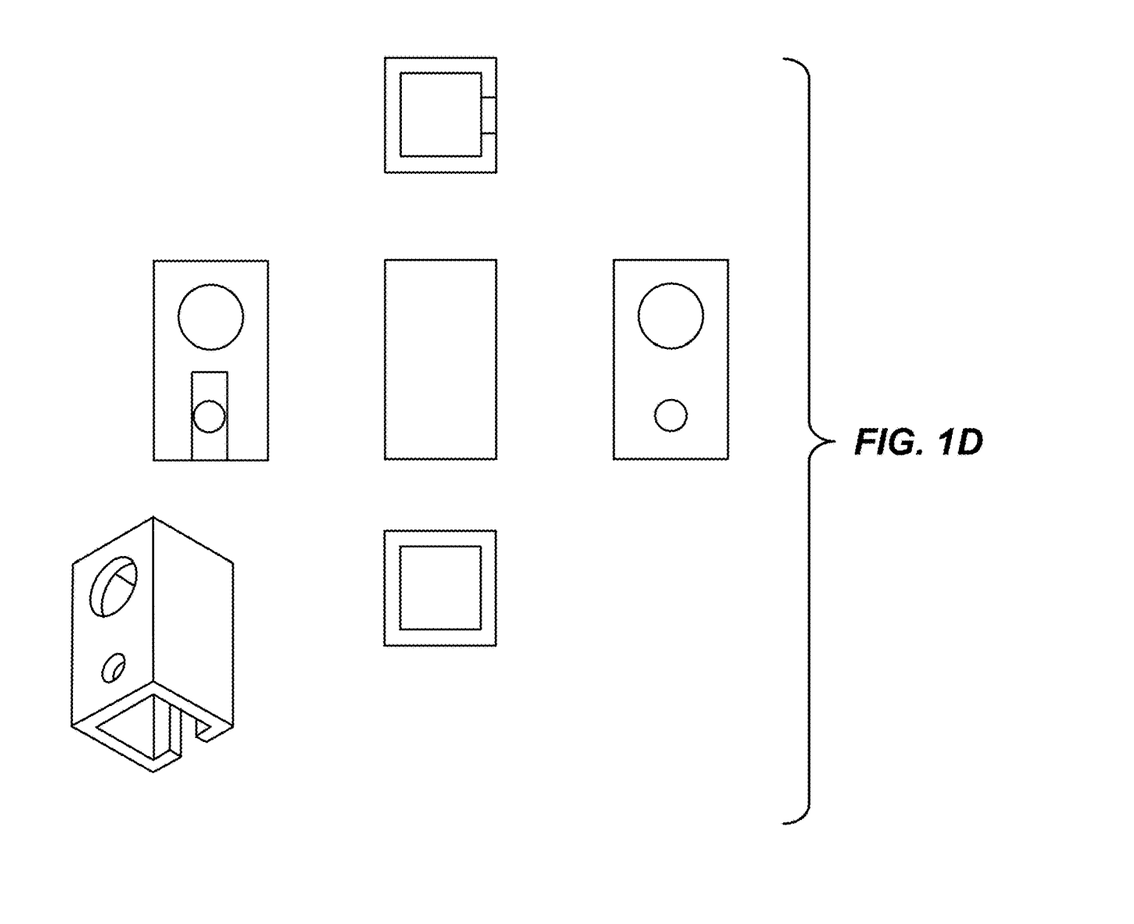
Figure 2:
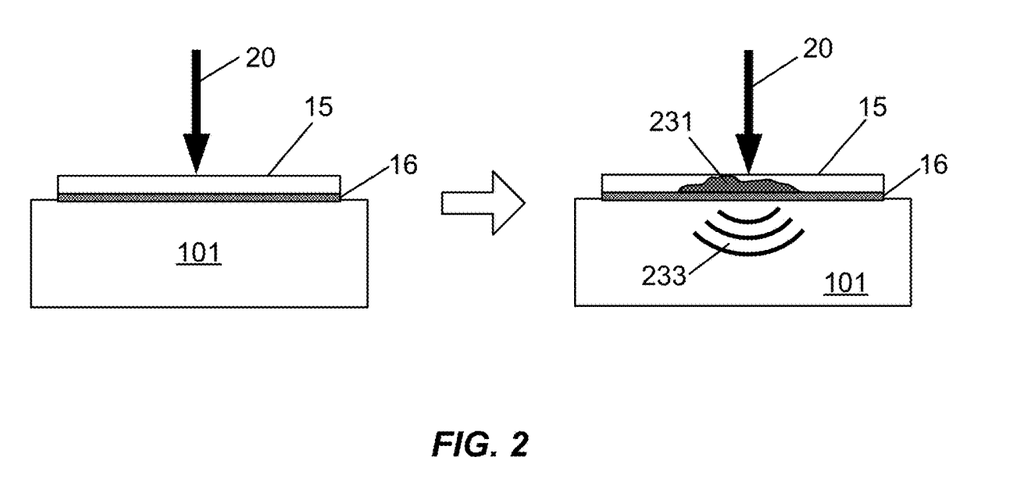
FIG. 2 shows an example of plasma being formed when carrying out methods provided herein.

An exemplary embodiment of a system 10 for imparting fatigue resistance to ceramic material 101 is shown in FIG. 1A, FIG. 1B, FIG. 1C, FIG. 1D and FIG. 2. The system 10 comprises a heat source 12 for heating the ceramic material to a temperature greater than a brittle-to-ductile transition temperature of the ceramic material 101; a probe 14 for mounting the ceramic material at a three-dimensional stage 150 (i.e., sample holder), the probe configured to extend the ceramic material 101 and the three-dimensional stage 150 into the heat source; a plasma-confining medium 15 and a sacrificial layer 16 disposed between the ceramic material 101 and the plasma-confining medium 15, the sacrificial layer 16 for forming plasma 231 (see FIG. 2) between the ceramic material 101 and the plasma-confining medium 15 when heated to a temperature greater than the brittle-to-ductile transition temperature of the ceramic material 101 and exposed to laser pulses 20; and a laser beam pulse generator 18 (or "laser pulse generator") for subjecting the ceramic material 101 to the laser pulses 20 via the sacrificial layer 16 and the plasma-confining medium 15 such that the laser beam pulse generator 18 is configured to pulse laser energy (e.g., in the form of laser pulses 20) through the plasma-confining medium 15 onto the sacrificial layer 16 to form the plasma 231 between the ceramic material 101 and the plasma-confining medium 15 as shown in FIG. 2.

The systems provided herein comprise a heat source for heating the ceramic material to a temperature greater than a brittle-to-ductile transition temperature of the ceramic material. The heat source may be any suitable heat source generally utilized to heat ceramic material. In exemplary embodiments, the heat source is configured to heat the ceramic material via a tubular chamber, e.g., a tube furnace. In certain embodiments of the system, the heat source 12 includes a pass-through 30 (see FIG. 1A). In an embodiment, the pass-through 30 allows the laser pulse generator 18 to be a separate device instead of a device incorporated into the heat source 12, each configuration of which is envisaged by the present disclosure. An example of a suitable heat source is a split tube furnace that can operate at a temperature of about 1250° C., which includes a pass-through 30. The temperature may vary depending on the particular application and/or materials being processed.

In certain embodiments, a probe 14 is provided for mounting the ceramic material 101 at a three-dimensional stage, the probe 14 being configured to extend the ceramic material into the heat source 12 as shown in FIG. 1A. Any suitable probe may be utilized to extend the ceramic material into the heat source. Generally, the configuration of the probe may depend on one or more factors including, e.g., the configuration of the heat source, the size of the ceramic material, and the like. In certain embodiments of the system, the probe includes a ceramic rod, which in certain embodiments is constructed of alumina, zirconia, or silica. In certain embodiments, the probe is constructed of alumina.

In certain embodiments, a sacrificial layer 16 is provided for forming a plasma on a surface of the ceramic material 101 exposed to the heat source 12. The sacrificial layer 16 is configured to contact at least a portion of the surface of the ceramic material 101 exposed to the heat source 12. The sacrificial layer 16 may be constructed of any suitable material for forming a plasma on a surface of the ceramic material. For example, in an embodiment, the sacrificial layer 16 comprises a metal foil capable of forming plasma when exposed to laser pulses and having oxidation resistance in a continuous service temperature greater than the brittle-to-ductile transition temperature of the ceramic material being processed. In certain embodiments, the sacrificial layer 16 includes a metal foil having a thickness of from about 50 to about 100 μm. In certain embodiments, the sacrificial layer 16 comprises an iron-containing alloy, a nickel-containing alloy, and combinations thereof. For example, the iron-containing alloy additionally may include nickel and/or chromium. In certain embodiments, the iron-containing alloy comprises austenitic stainless steel, ferritic steel, Inconel, or the like. In certain embodiments of the system, the sacrificial layer comprises austenitic stainless steel foil.

In certain embodiments, the ceramic material 101 is mounted to the probe 14 via a high temperature adhesive composition (not shown). In certain embodiments, the sacrificial layer 16 is mounted to the ceramic material 101 via a high temperature adhesive composition 40. Each high temperature adhesive composition may be selected from any suitable high temperature adhesive composition. Each high temperature adhesive composition may be the same or different. In certain embodiments, one or more of the high temperature adhesive compositions is selected from alumina, zirconia, aluminum nitride, graphite, silica, silicon carbide, or a combination thereof. In certain embodiments, each high temperature adhesive composition includes alumina.

In certain embodiments, a plasma-confining medium 15 is provided. The plasma-confining medium 15, such as glass, can be utilized to confine the expansion of the plasma and increase plasma pressure level and duration onto the ceramic material. The plasma-confining medium 15 may be configured to confine the plasma formed by the sacrificial layer 16 to a space contacting the surface of the ceramic material exposed to the heat source. In certain embodiments, the plasma-confining medium comprises a material transparent to the laser pulses and having a soften temperature greater than the brittle-to-ductile transition temperature of the ceramic material being processed. In certain embodiments, the plasma-confining medium comprises fused quartz, sapphire, transparent alumina, fused silica, or a combination thereof. In certain embodiments, the plasma-confining medium comprises fused silica.

In certain embodiments, an energy pulse generator 18 is provided. One example is a laser pulse generator. The laser pulse generator 18 may be utilized for subjecting the ceramic material 101 to laser pulses 20 via the sacrificial layer 16 and the plasma-confining medium 15. The laser pulse generator 18 is configured to pulse laser energy through the plasma-confining medium onto the sacrificial layer to form plasma in the space contacting the surface of the ceramic material formed by the plasma-confining medium. Any suitable laser pulse generator may be utilized to pulse laser energy through the plasma-confining medium onto the sacrificial layer. Generally, in certain embodiments, the laser pulse generator generates laser pulses having a wavelength of from about 800 nm to about 1200 nm, e.g., at about 1064 nm. In certain embodiments, the laser pulse generator is a neodymium-doped yttrium aluminum garnet ("Nd:YAG") laser pulse generator, e.g., Model PRII 8010 from Continuum Electro-Optics, San Jose, California Although the description herein discusses the energy pulse generator in the context of a laser pulse generator, one skilled in to art will recognize that other energy pulsing system may be used.

In certain embodiments, the system further comprises a three-dimensional stage (i.e., sample holder), e.g., sample holder 150 as shown in FIG. 1A and in more detail in FIG. 1B. Generally, the sample holder 150, when present, is configured to position (e.g., stabilize) the probe 14, the ceramic material 101, the sacrificial layer 16, and the plasma-confining medium 15 in the heat source 12, e.g., in the center of the tube within a cross section of a tubular chamber of the heat source. When present, any suitable sample holder may be utilized. As shown in the figures, sample holder 150 comprises frame 152 and positioner 154. As shown in the figures, frame 152 holds ceramic material 101, sacrificial layer 16, and plasma-confining medium 15 together, and connects with probe 14. Positioner 154 controls the position of the ceramic sample in heat source 12 to allow the laser pulse(s) to treat a surface of the sample.

A method of imparting fatigue resistance to ceramic material is provided. In certain embodiments, the method comprises heating ceramic material to a temperature greater than a brittle-to-ductile transition temperature of the ceramic material; and subjecting the ceramic material to laser pulses via a sacrificial layer and a plasma-confining medium such that a plasma of the sacrificial layer or coating forms between the ceramic material and the plasma-confining medium. A person having ordinary skill in the art should recognize that the system embodiments herein may be utilized to practice the method embodiments herein.

Without wishing to be bound by a particular theory, it is believed that, as a result of the methods provided herein, laser-driven shock waves 233 (see, e.g., FIG. 2) propagate into the ceramic material 101 and create a biaxial compressive residual stress field, which can extend below the surface of the ceramic material, e.g., to 1 mm or deeper below the surface.

The methods provided herein comprise heating ceramic material to a temperature greater than the brittle-to-ductile transition temperature of the ceramic material. In certain embodiments, the temperature greater than the brittle-to-ductile transition temperature of the ceramic material is from about 25° C. to about 1500° C., or from about 100° C., or from about 500° C., or from about 800° C., or from about 1000° C., to about 1500° C., or to about 1400° C., or to about 1300° C., or to about 1250° C. In certain embodiments of the methods, the temperature greater than the brittle-to-ductile transition temperature of the ceramic material is from about 1000° C. to about 1250° C.

In certain embodiments, the laser pulses have an energy of from about 0.1 to about 2 Joule. In certain embodiments, the laser pulses have a spot diameter of from about 0.1 to about 5 mm. In certain embodiments, the laser pulses have a duration of from about 1 to about 30 nanoseconds. In certain embodiments, the laser pulses have a pulse quantity of from 1 to 100 or more. In certain embodiments, the laser pulses have an incident laser power intensity of from about 1 to about 30 $GW/cm^2$. In certain embodiments, the laser pulses have an overlap ratio of from about 25 to about 90%.

Example Embodiments (1) A system for imparting fatigue resistance to ceramic material comprising:
a heat source for heating the ceramic material to a temperature greater than a brittle-to-ductile transition temperature of the ceramic material;
a probe for mounting the ceramic material at a three-dimensional stage, the probe configured to extend the ceramic material into the heat source;
a plasma-confining medium and a sacrificial layer, the sacrificial layer disposed between the ceramic material and the plasma-confining medium, the sacrificial layer for forming plasma between the ceramic material and the plasma-confining medium when heated to the temperature greater than the brittle-to-ductile transition temperature of the ceramic material and exposed to laser pulses or pulse laser energy; and
a laser pulse generator for subjecting the ceramic material to laser pulses via the sacrificial layer and the plasma-confining medium such that the laser pulse generator is configured to pulse laser energy through the plasma-confining medium onto the sacrificial layer to form the plasma between the ceramic material and the plasma-confining medium.

(2) The system of embodiment (1), further comprising a sample holder configured to position the probe, the ceramic material, the sacrificial layer, and the plasma-confining medium in the heat source.

(3) The system of embodiment (2), wherein the sample holder comprises a frame and positioner configured to center the probe within a cross section of a tubular chamber of the heat source.

(4) The system of any one of embodiments (1)-(3), wherein the laser pulses have a wavelength of from about 800 to about 1200 nm.

(5) The system of embodiment (4), wherein the laser pulses have a wavelength of about 1064 nm.

(6) The system of any one of embodiments (1)-(3), wherein the laser pulse generator is a neodymium-doped yttrium aluminum garnet ("Nd:YAG") laser pulse generator.

(7) The system of any one of embodiments (1)-(6), wherein the heat source is configured to heat the ceramic material via a tubular chamber.

(8) The system of any one of embodiments (1)-(7), wherein the heat source comprises a pass-through.

(9) The system of any one of embodiments (1)-(8), wherein the probe is a ceramic rod.

(10) The system of embodiment (9), wherein the ceramic rod is constructed of alumina.

(11) The system of any one of embodiments (1)-(10), wherein the ceramic material is mounted to the probe via a high temperature adhesive composition.

(12) The system of any one of embodiments (1)-(11), wherein the sacrificial layer comprises a metal foil capable of forming plasma when exposed to laser pulses and having oxidation resistance in continuous service temperature greater than the brittle-to-ductile transition temperature of the ceramic material.

(13) The system of any one of embodiments (1)-(11), wherein the sacrificial layer comprises austenitic stainless steel foil.

(14) The system of any one of embodiments (1)-(13), wherein the sacrificial layer has a thickness of about 50 to about 100 μm.

(15) The system of any one of embodiments (1)-(14), wherein the plasma-confining medium comprises a material transparent to the laser pulses and having a soften temperature greater than the brittle-to-ductile transition temperature of the ceramic material.

(16) The system of any one of embodiments (1)-(14), wherein the plasma-confining medium comprises fused silica.

(17) A method of imparting fatigue resistance to ceramic material comprising:
heating ceramic material to a temperature greater than a brittle-to-ductile transition temperature of the ceramic material; and
subjecting the ceramic material to energy pulses, e.g., laser pulses, via a sacrificial layer and a plasma-confining medium such that a plasma of the sacrificial coating forms between the ceramic material and a plasma-confining medium.

(18) The method of embodiment (17), wherein the temperature greater than the brittle-to-ductile transition temperature of the ceramic material is from about 25° C. to about 1500° C.

(19) The method of embodiment (17), wherein the temperature greater than the brittle-to-ductile transition temperature of the ceramic material is from about 1000° C. to about 1250° C.

(20) The method of any one of embodiments (17)-(19), wherein the ceramic material comprises a substance selected from alumina ("$Al_2O_3$"), zirconia ("$ZrO_2$"), yttrium-stabilized zirconia ("YSZ"), silicon carbide ("SiC"), boron carbide ("$B_4C$"), silicon nitride ("$Si_3N_4$"), aluminum nitride ("AlN"), zirconium boride ("$ZrB_2$"), hafnium boride ("$HfB_2$"), or a composite ceramic substance thereof.

(21) The method of any one of embodiments (17)-(20), wherein the laser pulses have a wavelength of from about 800 to about 1200 nm.

(22) The method of embodiment (21), wherein the laser pulses have a wavelength of about 1064 nm.

(23) The method of any one of embodiments (17)-(22), wherein the laser pulses have an energy from about 0.1 to about 2 Joule.

(24) The method of any one of embodiments (17)-(23), wherein the laser pulses have a spot diameter of from about 0.1 to about 5 mm.

(25) The method of any one of embodiments (17)-(24), wherein the laser pulses have a duration of from about 1 to about 30 nanoseconds.

(26) The method of any one of embodiments (17)-(25), wherein the laser pulses have a pulse quantity of from 1 to 100.

(27) The method of any one of embodiments (17)-(26), wherein the laser pulses have an incident laser power intensity of from about 1 to about 30 $GW/cm^2$.

(28) The method of any one of embodiments (17)-(27), wherein the laser pulses have an overlap ratio of from about 25 to about 90%.

EXAMPLES

The following examples further illustrate various embodiments but should not be construed as in any way limiting its scope.

Example 1

Figure 3A:
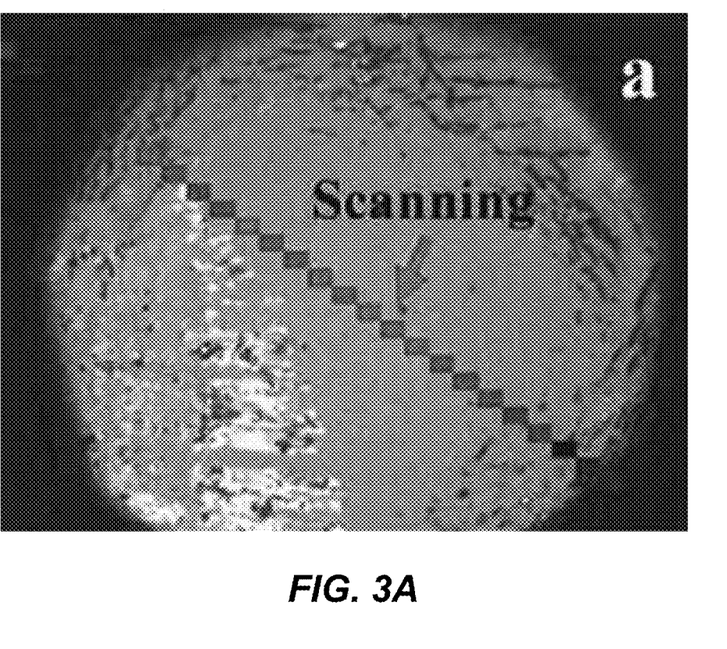
FIGS. 3A, 3B, 4A, 4B and 5 graphically illustrate results associated with the Example provided herein. It should be noted that, in FIG. 5 at the left portion of the graph, the upper tic mark of the "untreated" samples overlaps with the lower tic mark of the "LSP-treated" samples.
Figure 3B:
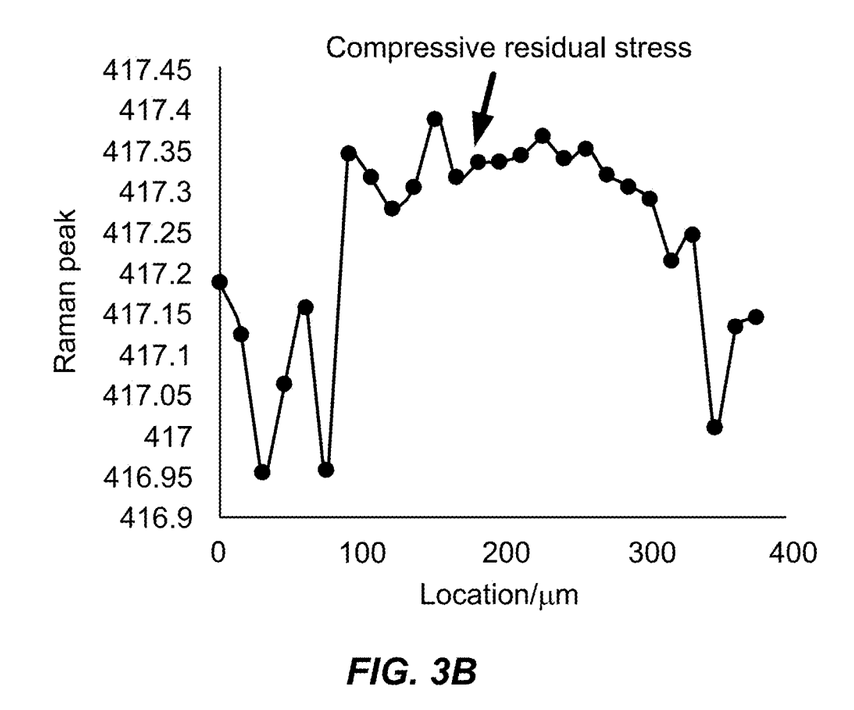

Single-crystal $Al_2O_3$ has been treated by LSP at 900° C. and 1000° C. using an embodiment. Transmission electron microscopy shows that substantial dislocations form near the surface. These dislocation activities suggest that the physical interaction between the laser-driven shock waves with the microstructures of ceramics can generate localized plastic deformation. The localized plastic deformation results in significant residual stresses. FIG. 3B shows the measured Raman peak position along the scanning line on the surface of LSP-treated single-crystal $Al_2O_3$ (FIG. 3A). The Raman peak shift ($\Delta\omega$) in single-crystal $Al_2O_3$ can be used to calculate the compressive residual stress ($\sigma$) by:

$$\Delta\omega = -0.44 * 10^{-9} \sigma (Pa)$$

The maximum compressive stress level on the surface is about −568 MPa.

Figure 4A:
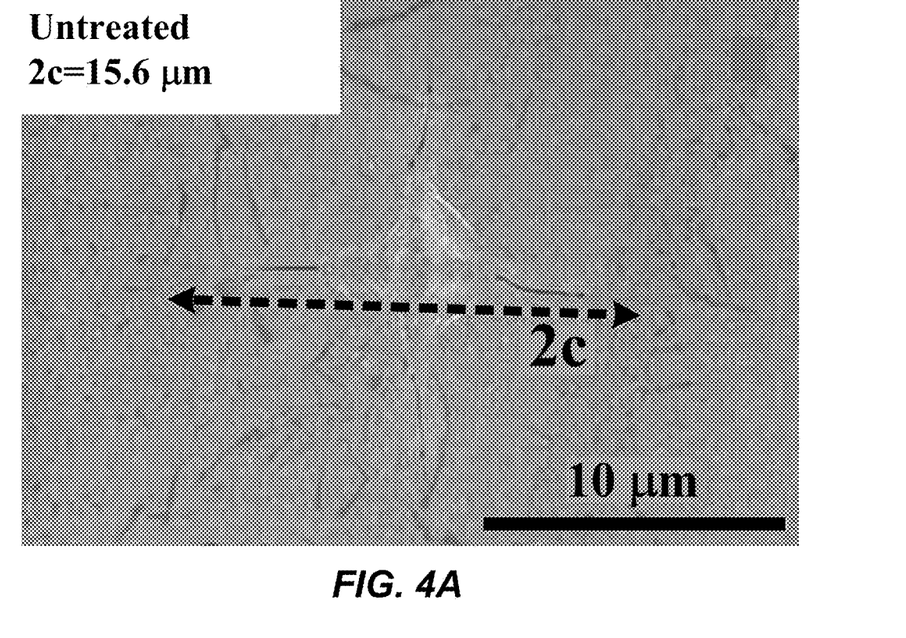
Figure 4B:
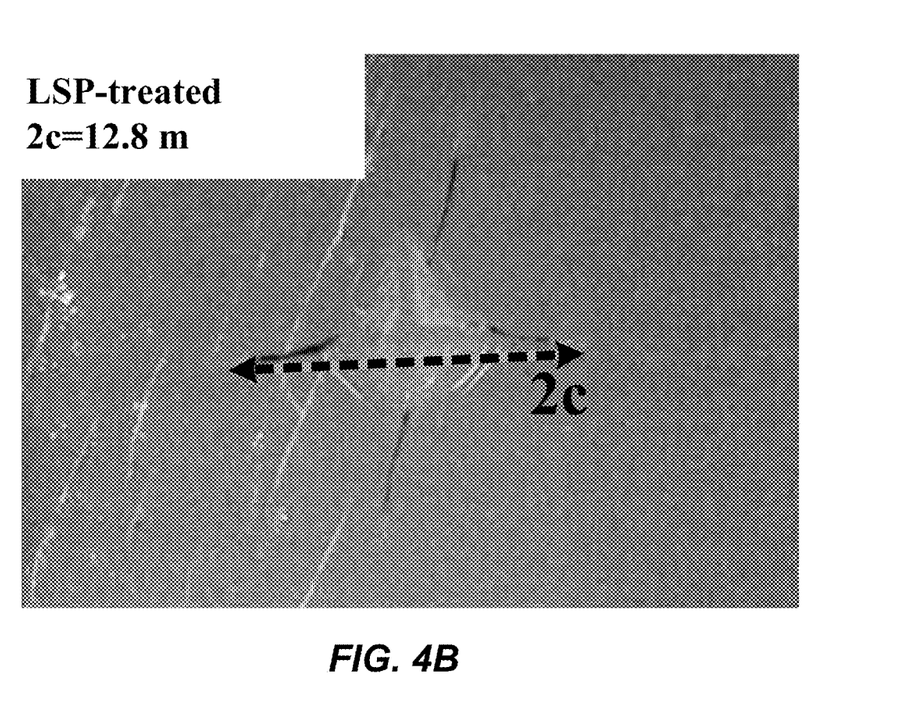

FIG. 4A and FIG. 4B show the representative scanning electron micrographs of Vickers indentation on single-crystal $Al_2O_3$ before and after LSP at 900° C. The radius of radial crack length (i.e., c) became much shorter (with 18% reduction) after LSP. $P/c^{3/2}$ has been used as an invariant to evaluate the cracking resistance, in which P is the load of indentation and c is the radius of radial cracks near the edges of Vickers indentation. The $P/c^{3/2}$ values in single-crystal $Al_2O_3$ increased by 29% after LSP at 900° C. Both the c and $P/c^{3/2}$ results support that LSP-treated single-crystal $Al_2O_3$ has improved resistance to surface-originated crack growth, which will improve fatigue resistance of ceramics.

Figure 5:
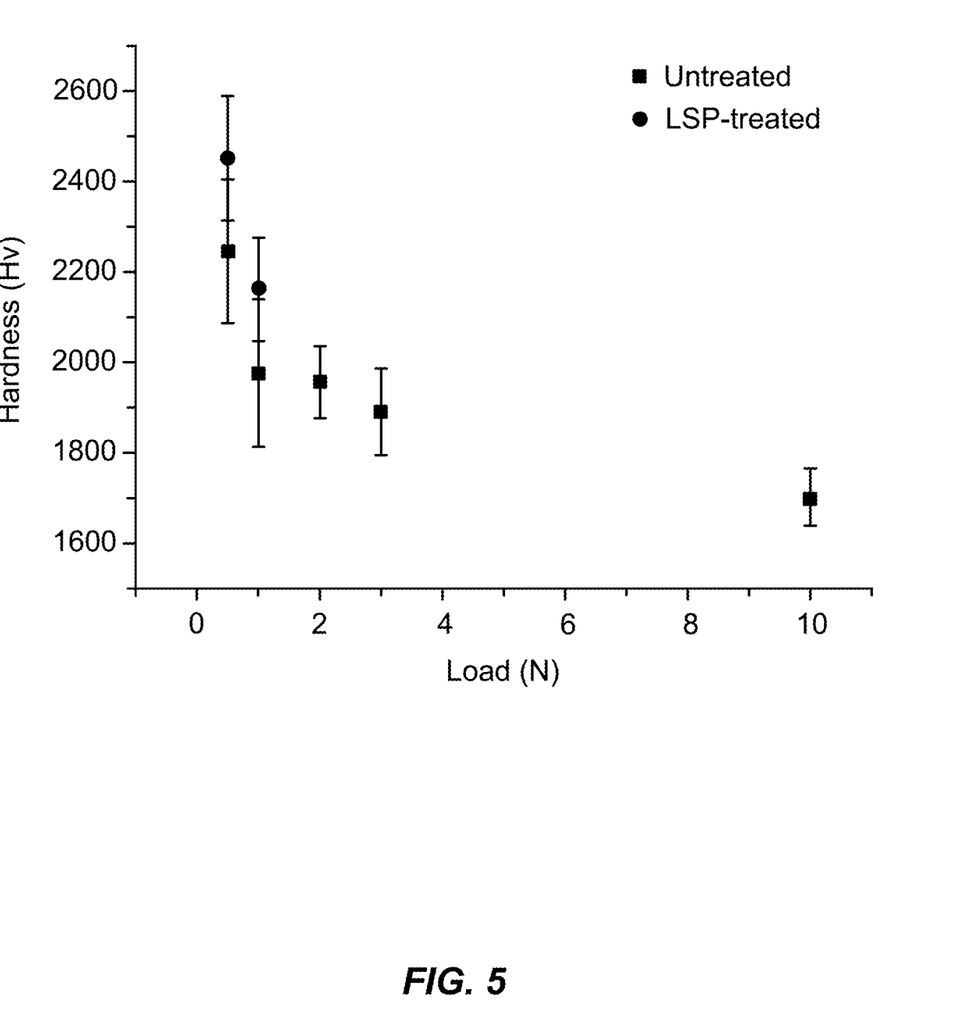

FIG. 5 shows the Vickers hardness in single-crystal $Al_2O_3$ before and after LSP at 900° C. The hardness of LSP-treated single-crystal $Al_2O_3$ is 9% higher than the untreated sample. These mechanical test results support that the high-temperature LSP process is able to advantageously improve the mechanical properties of ceramics.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Various embodiments are described herein. Variations of those embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of improving one or more mechanical properties of ceramic material, the method comprising:

heating a ceramic material to a temperature, T, greater than a brittle-to-ductile transition temperature of the ceramic material, wherein the temperature, T, is from 800° C. to 1500° C.; and subjecting the ceramic material, while at the temperature, T, to energy pulses via a sacrificial layer and a plasma-confining medium such that a plasma of the sacrificial coating forms between the ceramic material and a plasma-confining medium.

2. The method of claim 1, wherein the temperature, T, is from 1000° C. to 1250° C.

3. The method of claim 1, wherein the ceramic material comprises a substance selected from alumina ("$Al_2O_3$"), zirconia ("$ZrO_2$"), yttrium-stabilized zirconia ("YSZ"), silicon carbide ("SiC"), boron carbide ("$B_4C$"), silicon nitride ("$Si_3N_4$"), aluminum nitride ("AlN"), zirconium boride ("$ZrB_2$"), hafnium boride ("$HfB_2$"), or a composite ceramic substance thereof.

4. The method of claim 1, wherein the ceramic material is mounted to a ceramic probe comprising a material selected from the group consisting of alumina, zirconia and silica.

5. The method of claim 4, wherein the ceramic material is mounted to the ceramic probe via an adhesive composition comprising a material selected from the group consisting of alumina, zirconia aluminum nitride, graphite, silica, and silicon carbide.

6. The method of claim 1, wherein the sacrificial layer comprises a metal foil capable of forming plasma when exposed to laser pulses and having oxidation resistance at the temperature T.

7. The method of claim 1, wherein the sacrificial layer comprises a material selected from the group consisting of austenitic stainless steel foil, ferritic steel, iron, and nickel alloy.

8. The method of claim 1, wherein the plasma-confining medium comprises a material selected from the group consisting of fused silica, fused quartz, sapphire and transparent alumina.

9. The method of claim 1, wherein the energy pulses include laser pulses having a wavelength of from 800 to 1200 nm.

10. The method of claim 9, wherein the laser pulses have a wavelength of 1064 nm.

11. The method of claim 1, wherein the energy pulses include laser pulses having an energy from 0.1 to 2 Joule.

12. The method of claim 1, wherein the energy pulses include laser pulses having an incident laser power intensity of from 1 to 30 $GW/cm^2$.

13. The method of claim 1, wherein the energy pulses include laser pulses having an overlap ratio of from 25 to 90%.

14. The method of claim 1, wherein the energy pulses include laser pulses having a spot diameter of from 0.1 to 5 mm.

15. The method of claim 1, wherein the energy pulses include laser pulses having a duration of from 1 to 30 nanoseconds.

16. The method of claim 1, wherein the energy pulses include laser pulses having a pulse quantity of from 1 to 100.

* * * * *